(12) United States Patent
Wang et al.

(10) Patent No.: US 8,421,052 B2
(45) Date of Patent: Apr. 16, 2013

(54) TRANSVERSE FORCE, PRESSURE AND VIBRATION SENSORS USING PIEZOELECTRIC NANOSTRUCTURES

(75) Inventors: Zhong L. Wang, Marietta, GA (US); Peng Fei, Beijing (CN)

(73) Assignee: Georgia Tech Research Corporation, Atlanta, GA (US)

( * ) Notice: Subject to any disclaimer, the term of this patent is extended or adjusted under 35 U.S.C. 154(b) by 277 days.

(21) Appl. No.: 12/855,766

(22) Filed: Aug. 13, 2010

(65) Prior Publication Data

US 2011/0006286 A1 Jan. 13, 2011

Related U.S. Application Data

(63) Continuation-in-part of application No. 12/202,849, filed on Sep. 2, 2008.

(60) Provisional application No. 61/234,009, filed on Aug. 14, 2009.

(51) Int. Cl.
 *H01L 21/00* (2006.01)

(52) U.S. Cl.
 USPC .................................. 257/9; 257/24; 977/762

(58) Field of Classification Search ................ 257/9, 24; 977/762
 See application file for complete search history.

(56) References Cited

U.S. PATENT DOCUMENTS

| | | | |
|---|---|---|---|
| 6,123,819 A * | 9/2000 | Peeters | 204/452 |
| 6,325,904 B1 * | 12/2001 | Peeters | 257/414 |
| 6,863,943 B2 * | 3/2005 | Wang et al. | 428/37 |
| 7,051,945 B2 * | 5/2006 | Empedocles et al. | 235/492 |
| 7,083,104 B1 * | 8/2006 | Empedocles et al. | 235/491 |
| 7,163,659 B2 * | 1/2007 | Stasiak et al. | 422/82.01 |
| 7,220,310 B2 * | 5/2007 | Wang et al. | 117/68 |
| 7,342,656 B2 * | 3/2008 | Islam et al. | 356/301 |
| 7,521,274 B2 * | 4/2009 | Hersee et al. | 438/41 |
| 7,833,801 B2 * | 11/2010 | Stasiak et al. | 436/149 |
| 7,982,370 B2 * | 7/2011 | Wang et al. | 310/339 |
| 8,003,982 B2 * | 8/2011 | Wang et al. | 257/43 |
| 8,039,834 B2 * | 10/2011 | Wang et al. | 257/43 |
| 8,039,854 B2 * | 10/2011 | Hersee et al. | 257/91 |
| 8,053,376 B2 * | 11/2011 | Wang et al. | 438/780 |
| 8,076,701 B2 * | 12/2011 | Wang et al. | 257/213 |
| 2004/0106203 A1 * | 6/2004 | Stasiak et al. | 436/49 |
| 2004/0185251 A1 * | 9/2004 | Wang et al. | 428/397 |
| 2006/0169788 A1 * | 8/2006 | Empedocles et al. | 235/492 |
| 2006/0237537 A1 * | 10/2006 | Empedocles et al. | 235/439 |
| 2006/0254501 A1 * | 11/2006 | Wang et al. | 117/68 |
| 2008/0036038 A1 * | 2/2008 | Hersee et al. | 257/615 |
| 2008/0067618 A1 * | 3/2008 | Wang et al. | 257/415 |
| 2008/0204048 A1 * | 8/2008 | Stasiak et al. | 324/679 |
| 2009/0057650 A1 * | 3/2009 | Lieber et al. | 257/24 |
| 2009/0115293 A1 * | 5/2009 | Wang et al. | 310/364 |
| 2009/0169828 A1 * | 7/2009 | Hersee et al. | 428/172 |

(Continued)

*Primary Examiner* — Laura Menz
(74) *Attorney, Agent, or Firm* — Bryan W. Bockhop; Bockhop & Associates, LLC (57) ABSTRACT

An electrical device includes an insulating substrate; an elongated piezoelectric semiconductor structure, a first electrode and a second electrode. A first portion of the elongated piezoelectric semiconductor structure is affixed to the substrate and a second portion of the elongated piezoelectric semiconductor structure extends outwardly from the substrate. The first electrode is electrically coupled to a first end of the first portion of the elongated piezoelectric semiconductor structure. The second electrode is electrically coupled to a second end of the first portion of the elongated piezoelectric semiconductor structure.

15 Claims, 5 Drawing Sheets

U.S. PATENT DOCUMENTS

| | | | |
|---|---|---|---|
| 2009/0179523 A1* | 7/2009 | Wang et al. | 310/338 |
| 2010/0056851 A1* | 3/2010 | Wang et al. | 600/25 |
| 2011/0006286 A1* | 1/2011 | Wang et al. | 257/24 |
| 2011/0049579 A1* | 3/2011 | Dumitru et al. | 257/254 |
| 2011/0163292 A1* | 7/2011 | Wang et al. | 257/13 |
| 2011/0163636 A1* | 7/2011 | Sirbuly et al. | 310/339 |
| 2011/0166045 A1* | 7/2011 | Dhawan et al. | 506/39 |
| 2011/0168969 A1* | 7/2011 | Wang et al. | 257/10 |
| 2011/0253982 A1* | 10/2011 | Wang et al. | 257/24 |
| 2012/0001153 A1* | 1/2012 | Hersee et al. | 257/22 |
| 2012/0061348 A1* | 3/2012 | Wang et al. | 216/17 |
| 2012/0137783 A1* | 6/2012 | Wang et al. | 73/717 |
| 2012/0153860 A1* | 6/2012 | Wang et al. | 315/291 |
| 2012/0168710 A1* | 7/2012 | Wang et al. | 257/9 |
| 2012/0237853 A1* | 9/2012 | Wang et al. | 429/523 |

* cited by examiner

TRANSVERSE FORCE, PRESSURE AND VIBRATION SENSORS USING PIEZOELECTRIC NANOSTRUCTURES

CROSS-REFERENCE TO RELATED APPLICATION(S)

This application claims the benefit of U.S. Provisional Patent Application Ser. No. 61/234,009, filed Aug. 14, 2009, the entirety of which is hereby incorporated herein by reference.

This application is a continuation-in-part of, and claims the benefit of, U.S. patent application Ser. No. 12/202,849, filed Sep. 2, 2008, the entirety of which is hereby incorporated herein by reference.

STATEMENT OF GOVERNMENT INTEREST

This invention was made with government support under contract No. W31P4Q-08-1-0009, awarded by the U.S. Army. The government has certain rights in the invention.

BACKGROUND OF THE INVENTION

1. Field of the Invention

The present invention relates to gated electronic devices and, more specifically, to a gated electronic device that includes a nanoscale piezoelectric gating mechanism.

2. Description of the Related Art

One-dimensional (1D) nano-materials have profound applications in biological and chemical sensing, mechanical force and mass sensing, nano-electromechanics, optoelectronics, and electronics and photonics. Nanodevices made using individual semiconductor nanowires/nanotubes/nanobelts are often laterally bonded on a flat substrate following the configuration of a field effect transistor (FET), in which the substrate serves as a gate electrode; the current transported from the drain to source along the nanowire is controlled or tuned by the applied gate voltage or the chemical/biochemical species adsorbed on the surface of the nanowires. It is known that zinc oxide (ZnO) nanostructures exhibit both piezoelectric properties while under strain and semiconducting properties.

Most of the current nanodevices using 1D nanomaterials are usually bonded at both two ends, so that the two ends may not have the freedom to move. This type of configuration may not be advantageous for fabricating devices that simulate the action of hairy beams (such as the hairy sensing mechanism inside an ear), possibly preventing them from measuring nanoscale air or liquid flow.

Therefore, there is a need for a piezoelectric FET made using a free-standing ZnO wire for sensing transverse force/vibration.

SUMMARY OF THE INVENTION

The disadvantages of the prior art are overcome by the present invention which, in one aspect, is an electrical device that includes an insulating substrate; an elongated piezoelectric semiconductor structure, a first electrode and a second electrode. A first portion of the elongated piezoelectric semiconductor structure is affixed to the substrate and a second portion of the elongated piezoelectric semiconductor structure extends outwardly from the substrate. The first electrode is electrically coupled to a first end of the first portion of the elongated piezoelectric semiconductor structure. The second electrode is electrically coupled to a second end of the first portion of the elongated piezoelectric semiconductor structure.

In another aspect, the invention is a gated electrical device that includes an elongated piezoelectric semiconducting nanostructure, a first electrode, a second electrode, an insulative material and a bias voltage source. The elongated piezoelectric semiconducting nanostructure includes a first portion and a second portion contiguous thereto. The first electrode is electrically coupled to a first end of the first portion of the elongated piezoelectric semiconducting nanostructure. The second electrode is electrically coupled to a second end, spaced apart from the first end, of the first portion of the elongated piezoelectric semiconducting nanostructure. The insulative material covers the first portion of the elongated piezoelectric semiconducting nanostructure so as to prevent bending of the first portion of the elongated piezoelectric semiconducting nanostructure while allowing the second portion of the elongated piezoelectric semiconducting nanostructure to bend. The bias voltage source is coupled between the first electrode and the second electrode. The bias voltage source has a voltage selected to cause current to flow through the first portion of the semiconductor elongated structure when the second portion of the elongated piezoelectric semiconductor structure is bent by a predetermined amount and not to cause current to flow through the first portion of the semiconductor elongated structure when the second portion of the elongated piezoelectric semiconductor structure is bent by less than the predetermined amount.

In yet another aspect, the invention is a method of making a gated electrical device, in which a first portion of an elongated piezoelectric semiconductor structure is placed on a non-conductive substrate so that a second portion of the elongated piezoelectric semiconductor structure extends away from the substrate. A first metal is applied to a first end of the first portion of the elongated piezoelectric semiconductor structure so as to form a first electrode in electrical communication therewith. A second metal is applied to a second end, spaced apart from the first end, of the first portion of the elongated piezoelectric semiconductor structure so as to form a second electrode in electrical communication therewith.

These and other aspects of the invention will become apparent from the following description of the preferred embodiments taken in conjunction with the following drawings. As would be obvious to one skilled in the art, many variations and modifications of the invention may be effected without departing from the spirit and scope of the novel concepts of the disclosure.

DETAILED DESCRIPTION OF THE INVENTION

A preferred embodiment of the invention is now described in detail. Referring to the drawings, like numbers indicate like parts throughout the views. Unless otherwise specifically indicated in the disclosure that follows, the drawings are not necessarily drawn to scale. As used in the description herein and throughout the claims, the following terms take the meanings explicitly associated herein, unless the context clearly dictates otherwise: the meaning of "a," "an," and "the" includes plural reference, the meaning of "in" includes "in" and "on." Also as used herein, "fine nanowire" means a structure having a diameter of less than 5 μm and a length of at least 23 μm.

U.S. Pat. Nos. 6,586,095 and 7,220,310 (both issued to Wang et al.) disclose methods of making nanowires that may be used in the embodiments disclosed below and, therefore, these patents are incorporated herein by reference.

In one embodiment, the invention is a vibration sensor employing at least one piezoelectric nanostructure, such as a nanowire. A hearing aid embodiment employs an array of different nanowires having different resonant frequencies.

A zinc oxide (ZnO) nanowire (or other nano-structure, such as a nanorod or nanobelt) is placed on a substrate so that part of the nanowire extends from the substrate into the surrounding environment. The nanowire is secured to the substrate by two metal pads, one on each side of the nanowire. The ZnO nanowire is piezoelectric so that if it is bent, it generates an electrical potential between the two metal pads. By sensing this electrical potential, the system can detect movement of the ZnO nanowire in a manner similar to the manner in which a hair cell (such as one inside the inner ear) detects motion (such as the vibration of air molecules when a sound is created).

The resonant frequency of the nanowire is a function of its length and thickness. An array of these nanowires, each having different length/thickness parameters, would be sensitive to the specific resonant frequencies corresponding to the different nanowires. For example, one could construct an array of nanowires that corresponds to an auditory bandwidth. Employing an array of nanowires with a high density of nanowires in a small area can result in a high level of sensitivity. ZnO nanowires can be grown into arrays with controlled lengths and diameters, so that a nanowire-based hearing aid can cover a large frequency range.

Recent research in nanopiezotronics has studied the piezoelectric-coupled properties of ZnO nanowires and nanorods for fabricating electronic components. Theoretical calculation has demonstrated that when a one-end fastened zinc oxide (ZnO) nanowire (or other nano-scale structure) vibrates, it will generate a detectable electric signal at the fastened bottom end of the nanowire. The vibration of a ZnO nanowire can be tuned by the outer signal strength and frequency. Also, the morphology of the ZnO nanowire such as length, thickness can affect the resonance frequency of a nanowire. Therefore, by detecting the electric signal generated from the nanowire vibration, the system can then mimic the ion current influx in a hair cell and membrane.

Figure 1A:
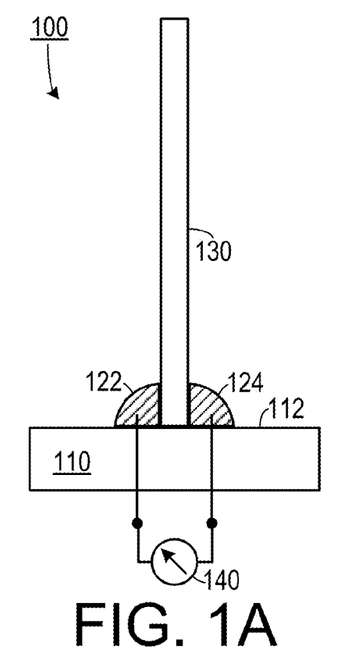
FIGS. 1A-1B are cross-sectional views of a piezoelectric nanowire vibration sensor.
Figure 1B:
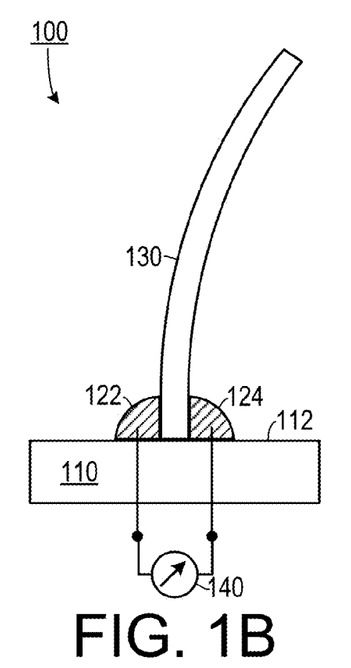

As shown in FIGS. 1A and 1B, one embodiment of a vibration sensor 100 includes a substrate 110, such as a silicon substrate, from which an elongated piezoelectric nano-scale structure 130 (for example, a zinc oxide nanowire) extends. A first electrical contact 122 and a spaced apart second electrical contact 124 are both disposed on a first surface 112 of the substrate 110 and are both in electrical communication with the base of the elongated piezoelectric nano-scale structure 130. The first electrical contact 122 and the second electrical contact 124 could both include, for example, metal pads.

An electrical detector 140 (for example, a voltage sensor) is configured to detect a voltage potential difference between the first electrical contact 122 and the second electrical contact 124 that is generated due to the piezoelectric effect when the elongated piezoelectric nano-scale structure 130 is bent from a first state, as shown in FIG. 1A, to a second state, as shown in FIG. 1B.

Figure 2:
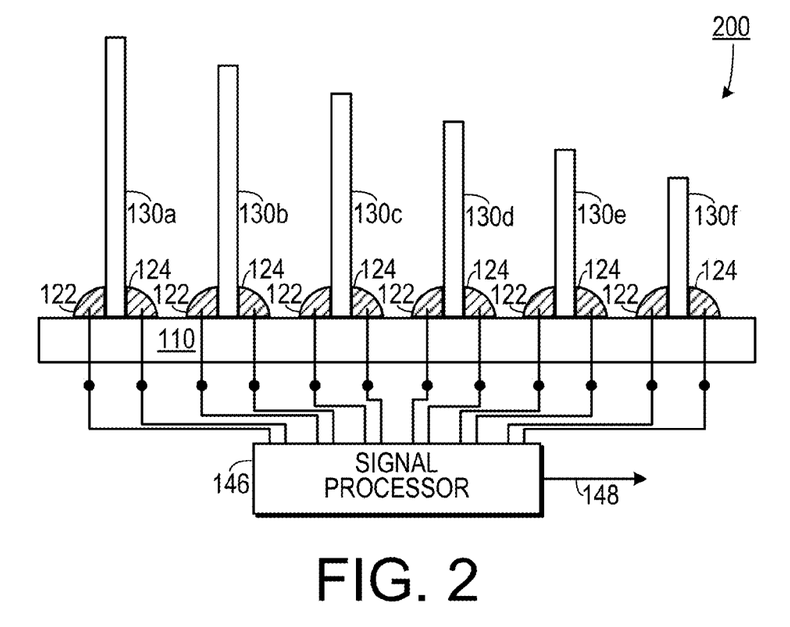
FIG. 2 is a cross-sectional view of an array of piezoelectric nanowire vibration sensors.

In one embodiment of a multi-frequency vibration sensor 200, as shown in FIG. 2, an array of elongated piezoelectric nano-scale structures 130a-f can extend from the substrate 110. Each of the of elongated piezoelectric nano-scale structures 130a-f can have a different length so that each is resonant with a different frequency component of a vibrating system. A signal processor 146 or a signal analyzer, which is responsive to each of the elongated piezoelectric nano-scale structures 130a-f then generates a signal 148 representative of the entire spectrum of vibration being sensed. This embodiment may be especially useful as a sensing element for a hearing aid.

Figure 3:
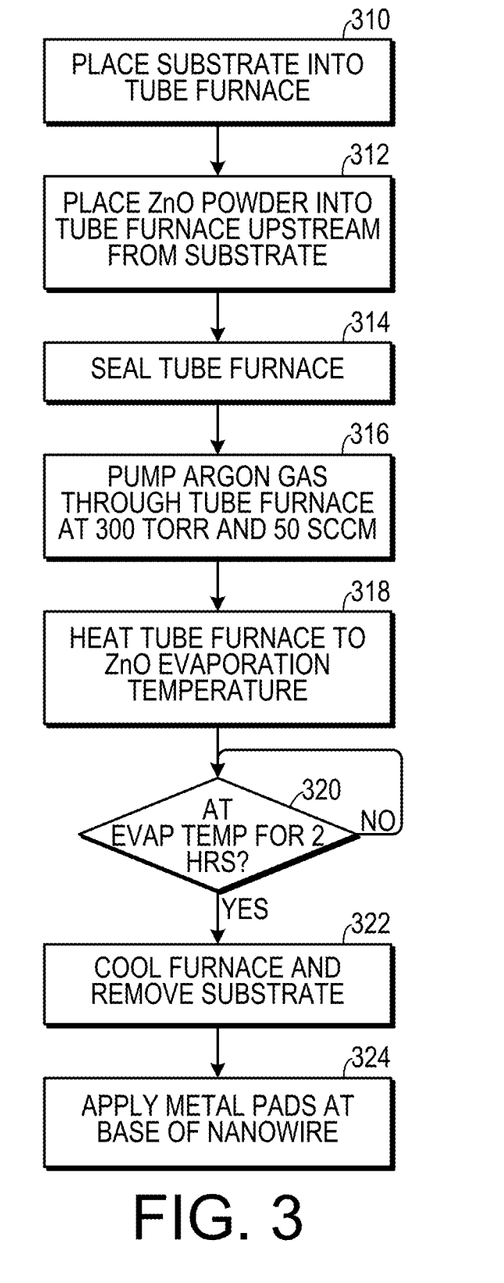
FIG. 3 is a flow chart demonstrating one embodiment of a method of making a piezoelectric nanowire vibration sensor.

In one embodiment of method of making a vibration sensor, a shown in FIG. 3, a substrate is placed into a tube furnace 310 and ZnO powder is place upstream of the substrate in the tube furnace 312. The furnace is sealed 314 and argon gas is pumped through the furnace at about 300 Torr and at about 50 SCCM 316. The furnace reaches a temperature corresponding to the evaporation temperature of ZnO and is maintained at that temperature for about two hours 320. The furnace is allowed to cool and the substrate is removed from the furnace 322. Metal pads are then applied to the bases of the nanowires 324, which may be done, for example, using an atomic force microscope.

In one embodiment, the vibration sensors disclosed herein mimic the mechanism of how a hair cell works, which potentially can be applied as an advanced category of hearing aid device option. Such sensors may find utility in many other types of applications, such as remote sound sensing systems.

Figure 4:
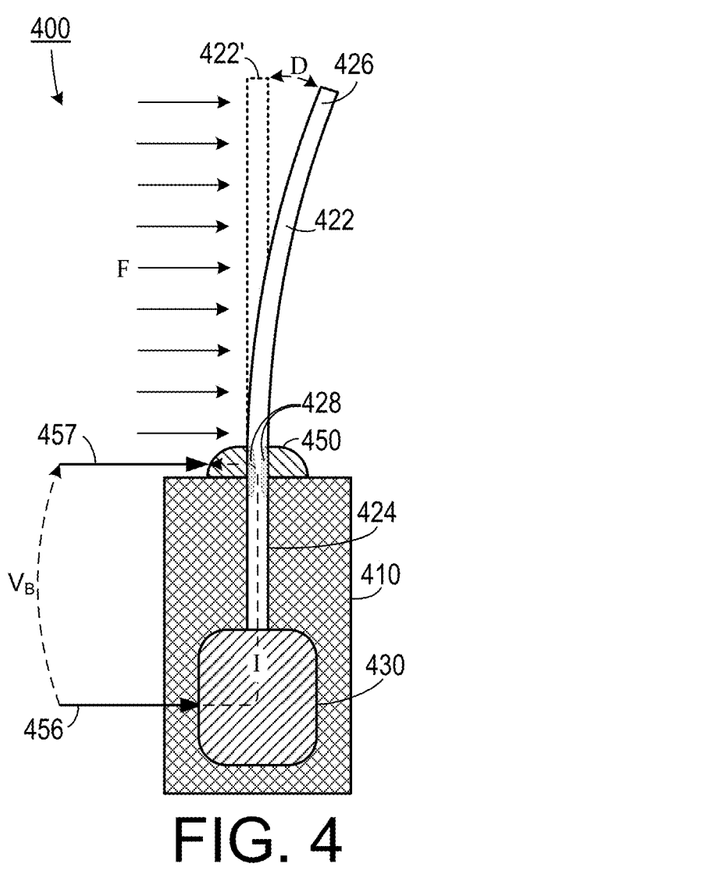
FIG. 4 is a schematic drawing on one embodiment of a freestanding nanowire field effect transistor.

This system offers several advantages, including: (1) Because the electric signal is generated from the nanowire vibration, it is a self power device. This eliminates a significant burden on the power source; (2) With the small and adjustable size of ZnO nanowires, they can easily be incorporated into the human cochlear system without affecting other functional hair cells in the ear; and (3) ZnO is biocompatible material As shown in FIG. 4, one embodiment of a force gated field effect transistor 400 includes a non-conducting substrate 410 (such as a glass or crystalline substrate) onto which a first portion 424 of a piezoelectric semiconducting fine nanowire 422 (such as a zinc oxide nanowire) is placed so that a second contiguous portion 426 of the fine nanowire 422 extends beyond the substrate 410. The first portion 424 is secured to the substrate 410 with a first metal conductor 430 (such as a silver electrode) and a second spaced-apart metal conductor 450 (such as a gold electrode). Two conductors 456 and 457 are in electrical communication with the first metal conductor 430 and the second metal conductor 450 and a bias voltage ($V_B$) is applied therebetween. The bias voltage, which could be sourced from a battery or the like, is selected so that when a force (F) applied to the second portion 426 is of sufficient intensity to bend by at least a deflection (D), then a current (I) will flow between the first metal conductor 430 and the second metal conductor 450. Also, when the force is insufficient to cause the second portion 426 to bend by deflection (D), then current will substantially fail to flow between the first metal conductor 430 and the second metal conductor 450. It is believed that when the second portion 426 is bent, then a depletion region 428 forms at the base of the second portion 426, which is an area of high strain in the nanowire 422. (It is understood that deflection D shown in FIG. 4 is illustrative only and is not necessarily drawn to scale. It is also understood that the actual deflection necessary to cause conduction through the nanowire could differ from the deflection shown.)

Figure 5A:
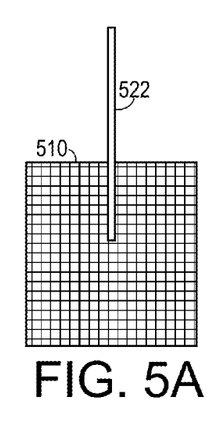
FIGS. 5A, 5C, 5E and 5G are plan view schematic drawings showing fabrication of the embodiment shown FIG. 4.
Figure 5B:
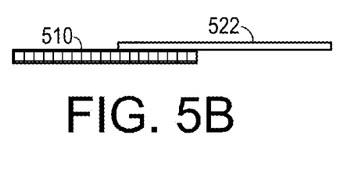
FIGS. 5B, 5D, 5F and 5H are side elevational view schematic drawings corresponding to FIGS. 5A, 5C, 5E and 5G, respectively.
Figures 5C, 5D:
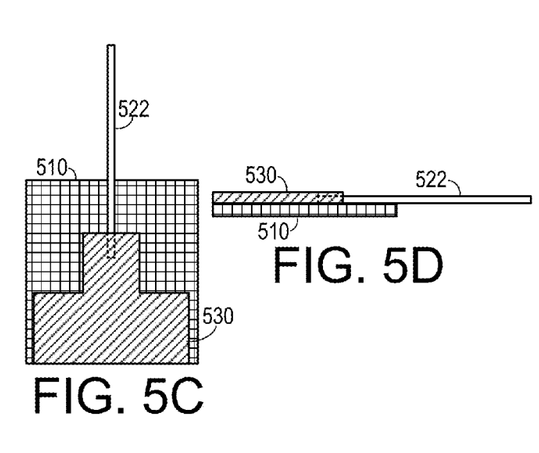
Figure 5E:
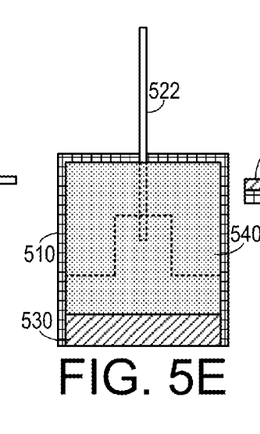
Figure 5F:
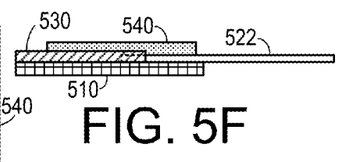
Figure 5G:
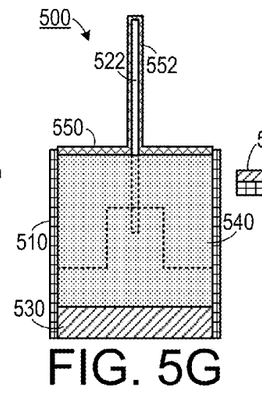
Figure 5H:
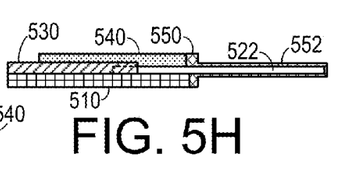

In one embodiment, as shown in FIGS. 5A-5H, a gated electrical device 500 may be made by placing a fine piezoelectric semiconducting nanowire 522 (e.g., a ZnO nanowire) on a glass substrate 510, as shown in FIGS. 5A-5B. As shown in FIGS. 5C-5D, a silver paste is applied to the bottom end of the nanowire 522 and the substrate 510 to form a first electrode 530. A layer 540 of an organic polymer, such as polydimethylsiloxane (PDMS), is applied to cover a portion of the first electrode 530 and a first portion of the nanowire 522, as shown in FIGS. 5E-5F. Gold is then deposited (using, for example a vapor deposition process) onto a top portion of the substrate and around the exposed second portion of the nanowire 522 so as to form a second electrode 550 and a shell 552 around part of the nanowire 552, as shown in FIGS. 5G-5H.

In one experimental embodiment, a freestanding piezoelectric FET (FS PE-FET) based on the piezotronic effect was fabricated. This device took advantage of the distribution of a piezoelectric potential in a ZnO wire when it is subjected to mechanical straining. For a vertical free-standing ZnO wire, once it is bent by an external force that is uniformly applied perpendicular to the wire along its length, a piezoelectric potential drop is created across the wire. On the basis of a static model calculation with considering the screening effect of free charge carriers, for a vertical ZnO wire on an identical ZnO substrate with a donor concentration $p=1\times10^{23}/m^3$, diameter d=25 nm, and length l=600 nm, when a total external force of $f_y$=800 nN was uniformly applied normal to the wire at its side surface, the piezoelectric potential distribution across the bent wire oriented with its c-axis pointing upward at room temperature (RT) was calculated. An outstanding feature noticed was that there is a reverse potential distribution at the junction region between the wire and the substrate, with the compressive strained region positive and the tensile strained region negative. The significant large magnitude of this transverse potential forces the n-type charge carriers (electrons) to accumulate at the compressive region to partially screen the local positive piezoelectric potential, resulting in highly concentrated electron carriers at the region near the root. At the same time, when the conduction band is pushed down by the piezoelectric polarization on the compression side, the electrons will be strongly degenerate with a very high density. Therefore, the increase of free electron density is much larger than the decrease on the tensile side. Consequently, the total number of free charge carriers near the wire root would increase. The overall effect is thus an increase in the conductance. The existence of this local "necking region" with super-high carrier density is believed to be important to the operability of this experimental device.

Figure 6:
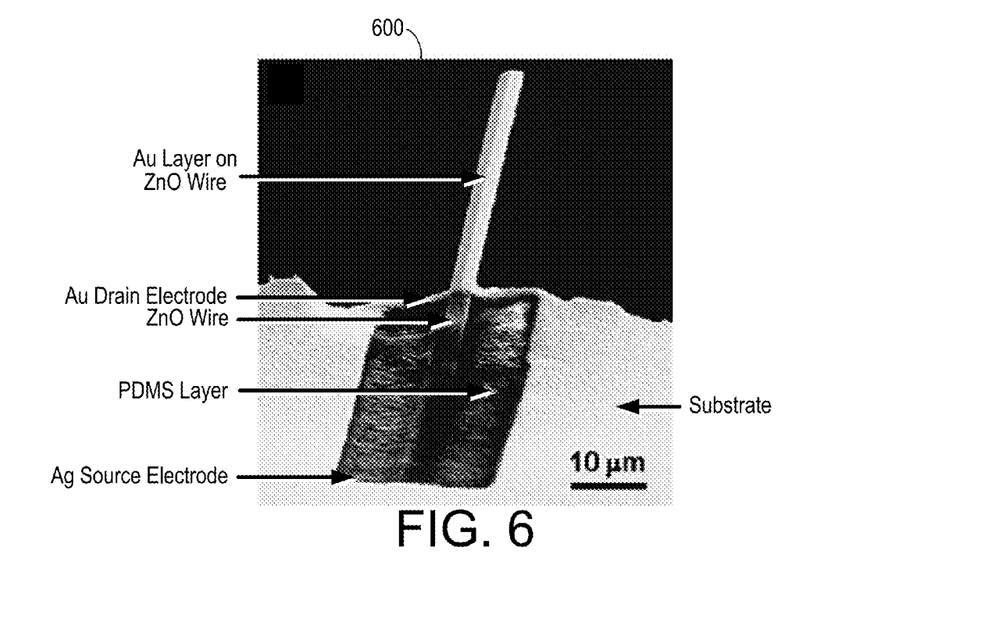
FIG. 6 is a micrograph of a freestanding nanowire field effect transistor.

To utilize the piezoelectric potential created at the root region, a FSPE-FET 600 has been built, a micrograph of which is shown in FIG. 6, in which a ZnO fine nanowire is partially embedded in a substrate and partially standing out. After coating the top part with metal and bottom part near the root with a protective insulating PDMS layer, a bias from the bottom of the wire and the metal contact was applied using two probes. The insulative layer at the root region can effectively minimize the equal potential effect introduced by the metal layer coated at the top part and thus protects the bottom reverse depletion region. Thus, a FS PE-FET is configured in which the channel formed by the piezo-potential at the wire-substrate junction forces the electrons to flow through the region where there are accumulated charge carriers (e.g., the positive piezoelectric potential region). Since the magnitude of the piezo-potential increases almost linearly with the applied force or degree of wire bending, the transported current is a measure of the force. This is the principle of the piezoelectric potential gated transistor, which is a sensor for measuring the transversely applied force on the wire.

The FS PE-FET was fabricated by using thin film deposition techniques and manipulation under an optical microscope. As shown in FIG. 6, a scanning electron microscope (SEM) image 600 taken from a device after side cutting using a focused ion beam (FIB) microscope shows the inner structure of the device. The Au-PDMS-ZnO layered structure is clear from the image. The PDMS layer ensures that the functioning parts of the ZnO wire and the Ag source electrode are not shorted by Au deposition. For the electrical measurement of this sensor device, two tungsten tips were contacted, respectively, with the Ag source electrode and Au drain electrode for connecting the device to the measurement system. After a bias voltage V) (Vs-Vd) is applied between the source and drain electrodes, the free charge carriers will flow through the rooted region of the ZnO PFW where a high profile of local accumulated free charge carriers exist. The resulting I-V curve showed that there is a Schottky barrier between the source electrode and ZnO PFW. When the PFW is transversely bent by an external force, a piezoelectric potential is created across the root junction region adjacent to the substrate, which may play a similar role as the gate voltage applied between the gate and the base electrode in a MOS FET device. So, this is a type of piezoelectric potential gated FET.

Figure 7A:
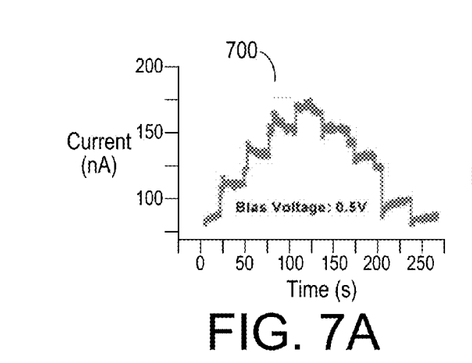
FIGS. 7A and 7B are graphs showing results of one experimental embodiment.
Figure 7B:
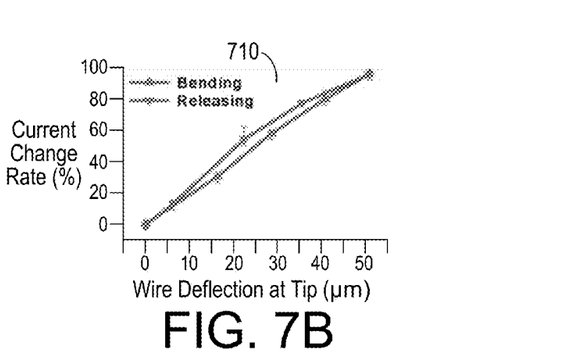

The reverse piezoelectric potential distribution across the junction region is an important aspect of this embodiment. In one experiment, the ZnO cantilever was transversely pushed and released step by step for a total of four times using an aluminum oxide coated insulator tip, which was mounted on a high resolution positioner. This is demonstrated in the current vs. time curve 700 shown in FIG. 7A. With the increase of the degree of bending, the increase in conductance was noticed. After retracting the tip and setting the PFW to free, the current returned to its original level. This experiment shows that the piezoelectric potential created at the root of the PFW is effective for tuning the transported electrical current and it can be used as a force sensor. This is also demonstrated by the current change rate vs. wire deflection curve 710 shown in FIG. 7B. In this experiment, the PFW was bent step by step and then released step by step under a constant bias voltage ($V_B$) of 0.5 V.

The sensor device can also be activated by a gas flow. When an argon gas flow pulse was transversely applied to a ZnO cantilever with a 5 second cycle, the cantilever was impacted and bent with a corresponding periodic current peak measured under a fixed bias voltage of 0.5 V. The highest current peak detected here was 180 nA; in comparison with the baseline of 120 nA, the corresponding variation rate is 50%. One peak was extracted for showing detailed profile. It has a rise time of about 20 ms, which indicates the response speed of the device is faster than 20 ms with considering the electronic response of the measurement system. Periodic continuous gas blowing was also applied to the ZnO cantilever with a 5 second cycle.

An important functional part of this device is believed to be the junction region at the root of the ZnO PFW, which is buried inside the PDMS layer. The working principle of the device is suggested as follows. Once subjected to mechanical impact, the bent ZnO PFW cantilever creates a piezoelectric potential distribution across its width in this junction region and simultaneously produces local depletion and reverse depletion layers, which triggers and controls the device. The size of the area and the local donor concentration of the reverse depletion layer are both dominated by the external force/pressure/vibration induced piezoelectric potential. The sensor device has a high piezoelectric potential control sensitivity (in the range of micro-Newtons) in micrometer scale due to the freestanding cantilever structure and fairly stable linear relationship between the mechanical stimulation and its electrical response. At the same time, it has a response time of less than 20 ms. This device may have potential applications as hearing aids, AFM cantilevers, force/pressure sensors, security systems and others.

In this experimental embodiment, the long ZnO wires were grown using a vapor-solid process. ZnO powder was used as the source material and loaded in an alumina boat located at the center of an alumina tube (75 cm), which was placed in a single-zone horizontal tube furnace. Argon gas was used as carrier gas at a flow rate of 50 standard cubic centimeters per minute (sccm) throughout the experiment. An alumina substrate with length of 10 cm was loaded 20 cm downstream from the source material. The furnace was heated to 1475° C. and was held at that temperature for 4.5 hours under a pressure of about 250 mbar. Then the furnace was turned off, and the tube was cooled down to room temperature under an argon flow.

The FS PE-FET was fabricated by the following procedures. First, single crystal long ZnO piezoelectric fine wires (PFWs) were used in the experiment, which were about 400 µm in length about 4 µm in diameter and were synthesized by thermal evaporation. The large size PFWs were chosen for easy manipulation under an optical microscope. The sample principle applies to smaller nanowires. Second, a glass slice with a length of about 2 cm, a width of about 1 cm, and a thickness of about 1.5 mm was prepared. The slice was washed with deionized water and ethanol. After drying with flowing nitrogen gas and baking in a furnace at 80° C. for 15 minutes, the glass slice was ready to be used as an insulating substrate. Third, the ZnO PFW was placed on the glass substrate with part of the wire standing out of the edge and forming a cantilever structure. Silver paste was applied to affix the end of ZnO wire on the substrate and form the source electrode. Fourth, a thin layer of polydimethylsiloxane (PDMS) was used to package part of the Ag electrode and the on-substrate part of the wire. The thickness of this PDMS layer is larger than the diameter of the wire and the thickness of the silver electrode to make sure the wire and the electrode were insulated inside the PDMS. By this step, the source electrode can avoid short-circuiting with the Au drain electrode that is to be deposited in the next step and the preservation of the piezoelectric potential generated at the junction region by minimizing the equipotential effect introduced by Au deposition. After being baked at 80° C. for 30 minutes, the PDMS layer was fully polymerized and functioned well as an insulating layer. Finally, the device was shadowed by a mask so that an Au film was deposited only at the top free-standing segment by an E-beam evaporator. As the triggering part of the sensor device, the cantilever was a core-shell Au—ZnO structure with the Au shell working as drain electrode of the device.

The above described embodiments, while including the preferred embodiment and the best mode of the invention known to the inventor at the time of filing, are given as illustrative examples only. It will be readily appreciated that many deviations may be made from the specific embodiments disclosed in this specification without departing from the spirit and scope of the invention. Accordingly, the scope of the invention is to be determined by the claims below rather than being limited to the specifically described embodiments above.

What is claimed is:

1. An electrical device, comprising:
   a. an insulating substrate;
   b. an elongated piezoelectric semiconductor structure, including a first portion and a second portion that is contiguous with the first portion, the first portion being secured to the substrate at a first end of the first portion and also being secured to the substrate at a second end of the first portion that is spaced apart from the first end, the second portion extending outwardly from the second end of the first portion;
   c. a first electrode that is electrically coupled to the first end of the first portion of the elongated piezoelectric semiconductor structure;
   d. a second electrode that is electrically coupled to the second end of the first portion of the elongated piezoelectric semiconductor structure; and
   e. a bias voltage source coupled between the first electrode and the second electrode, the bias voltage source having a voltage selected to cause current to flow through the first portion of the semiconductor elongated structure when at least a predetermined lateral force is applied to the second portion of the elongated piezoelectric semiconductor structure and not to cause current to flow through the first portion of the semiconductor elongated structure when less than the predetermined lateral force is applied to the second portion of the elongated piezoelectric semiconductor structure.

2. The electrical device of claim 1, wherein the elongated piezoelectric semiconductor structure comprises a structure selected from a group consisting of: a nanowire, a nanorod and a nanobelt.

3. The electrical device of claim 1, wherein the elongated piezoelectric semiconductor structure comprises a zinc oxide nanostructure.

4. The electrical device of claim 3, wherein the zinc oxide nanostructure comprises a fine nanowire.

5. The electrical device of claim 1, further comprising an insulating layer deposited onto the substrate and covering the first portion of the elongated piezoelectric semiconductor structure and a portion of the first electrode.

6. The electrical device of claim 5, wherein the insulating layer comprises an organic polymer.

7. The electrical device of claim 1, wherein the first electrode comprises silver.

8. The electrical device of claim 1, wherein the second electrode comprises gold.

9. The electrical device of claim 1, wherein the insulating substrate comprises a material selected from a group consisting of: a glass, a crystalline substance and combinations thereof.

10. A sensor, comprising:
   a. an insulating substrate;
   b. a piezoelectric semiconductor zinc oxide nanowire, including a first portion and a second portion, the first portion being secured to the substrate at a first end of the first portion and also being secured to the substrate at a second end of the first portion that is spaced apart from the first end, the second portion extending outwardly from the substrate and contiguously from the first portion;

c. a first electrode that is electrically coupled to the first end of the first portion of the zinc oxide nanowire;

d. a second electrode that is electrically coupled to a the second end of the first portion of the zinc oxide nanowire; and e. a bias voltage source coupled between the first electrode and the second electrode, the bias voltage source having a voltage selected to cause current to flow through the first portion of the zinc oxide nanowire when at least a predetermined lateral force is applied to the second portion of the [e] zinc oxide nanowire and not to cause current to flow through the first portion of the zinc oxide nanowire when less than the predetermined lateral force is applied to the second portion of the zinc oxide nanowire.

11. The sensor of claim 10, further comprising an insulating layer deposited onto the substrate and covering the first portion of the elongated piezoelectric semiconductor structure and a portion of the first electrode.

12. The sensor of claim 11, wherein the insulating layer comprises an organic polymer.

13. The sensor of claim 10, wherein the first electrode comprises silver.

14. The sensor of claim 10, wherein the second electrode comprises gold.

15. The sensor of claim 10, wherein the insulating substrate comprises a material selected from a group consisting of: a glass, a crystalline substance and combinations thereof.

* * * * *